ure of Patent: Dec. 5, 1989

United States Patent [19]
Katanosaka

[11] Patent Number: 4,885,721
[45] Date of Patent: Dec. 5, 1989

[54] SEMICONDUCTOR MEMORY DEVICE WITH REDUNDANT MEMORY CELLS

[75] Inventor: Naoki Katanosaka, Tokyo, Japan

[73] Assignee: NEC Corporation, Tokyo, Japan

[21] Appl. No.: 242,452

[22] Filed: Sep. 9, 1988

[30] Foreign Application Priority Data

Sep. 10, 1987 [JP] Japan ................. 62-227612

[51] Int. Cl.⁴ .............................. G11C 7/00
[52] U.S. Cl. ................... 371/10.2; 365/200
[58] Field of Search ........... 365/200, 230.06, 201; 371/10, 11, 21

[56] References Cited

U.S. PATENT DOCUMENTS 4,635,190  1/1987  Meyer et al. ................. 365/200

Primary Examiner—Joseph A. Popek
Attorney, Agent, or Firm—Sughrue, Mion, Zinn, Macpeak & Seas

[57] ABSTRACT

There is disclosed a semiconductor memory device having a redundant decoder units each storing a row address assigned to a defective memory cell replaced with a redundant memory cell, and a redundant state detection unit provided with an address detecting section operative to produce a first detecting signal when a row address represented by a row address signal is identical with one of the row addresses respectively stored in the redundant decoder units, and the address detecting section comprises a single bypassing transistor coupled between a first node applied with a first voltage level and a second node where the first detecting signal appears, a single bootstrapping circuit operative to supply a gate electrode of the bypassing transistor with a second voltage level higher than the first voltage level by a value slightly lower than a threshold voltage of the bypassing transistor, and a plurality of activating transistors coupled in parallel between a source of a third voltage level and the bootstrapping circuit and having respective gate electrodes coupled to the redundant decoder units, respectively, so that the bypassing transistor and the bootstrapping circuit are shared by all of the redundant decoder units, thereby reducing the component transistors.

10 Claims, 2 Drawing Sheets

FIG. 1 PRIOR-ART

SEMICONDUCTOR MEMORY DEVICE WITH REDUNDANT MEMORY CELLS

FIELD OF THE INVENTION

This invention relates to a semiconductor memory device with redundant memory cells and, more particularly, to a redundant state detection circuit for the redundant memory cells.

BACKGROUND OF THE INVENTION

A typical example of the semiconductor memory device is illustrated in FIG. 1 of the drawings and fabricated on a single semiconductor chip 1. The semiconductor memory device largely comprises a plurality of memory cells 2 arranged in rows and columns (which is called as a memory cell array), a redundant memory cells 3 arranged in a plurality of rows, an address buffer circuit 4 associated with a plurality of address terminals 5 and temporary storing address signls, which are used as a row address signal and a column address signal, supplied from an outside source (not shown), a row address decoder circuit 6 operative to decode the row address signal for selecting one of the rows from the memory cell array 2, a redundant decoder unit 7 operative to produce a replacing signal on the basis of the row address signal for causing the row address decoder circuit 6 to be shifted into inactive state and selecting one of the rows from the redundant memory cells 3, and a redundant state detection unit 8 operative to memorize a replacement of the row or rows of the memory cell array 2 with the row or rows of the redundant memory cells 3 for trouble shooting.

The redundant decoder unit 7 is provided with a plurality of redundant decoder circuits 9, 10 and 11 and n-channel type field effect transistors 12, 13 and 14 respectively associated with the redundant decoder circuits 9, 10 and 11, and the n-channel type field effec transistors 12, 13 and 14 are coupled in parallel between a positive voltage source Vcc and the row address decoder circuit 6. Though not shown in the drawings, each of the redundant decoder circuits 9 to 11 has a fuse element which is disconnected when a memory cell of the aarry 2 is rejected as a defective cell and, accordingly, replaced with a redundant memory cell. When a redundant decoder circuit detects the row address assigned to the memory cell of the array 2 replaced with the redundant memory cell, a high level signal is produced by the redundant decoder circuit and the n-channel type filed effect transistor turns on with the high level signal. Then, the n-channel type field effect transistor propagates a replacing signal of the positive voltage level Vcc which is applied to the row decoder circuit 6. With the replacing signal, the row address decoder circuit 6 keeps inactive and, for this reason, does not respond to the row address signal, but one of the redundant word lines is activated for one of the rows of the redundant memory cells, so that data bits are read out from the redundant memory cells coupled to the redundan word line instead of the memory cells of the array 2.

The redundant state detection unit 8 is provided with a replacement memorizing section 12' and an address detecting section 13'. The replacement memorizing section 12' has a series combination of three n-channel type field effect transistors 14', 15 and 16 and a fuse element 17 coupled between a testing terminal 18 and a diagnostic terminal 19 (which further serves as a power supplying terminal), and ech of the n-channel type field effect transistors 14' to 16 has a gate electrode coupled to a source electrode thereof. When at least one memory cell of the array 2 was replaced with a redundant memory cell, the fuse element 17 was destroyed for disconnecting the n-channel type field effect transistor 16 from the diagnostic terminal 19. However, if no defective memory cell is detected during the diagnosis operation, the fuse element 17 can provide a conduction path between the n-channel type field effect transistor 16 and the diagnostic terminal 19. Thus, the replacement memorizing section 12' is capable of memorizing a historical information whether or not a memory cell of the array 2 has been replaced with a redundant memory cell.

Upon the later diagnosis operation, the positive voltage level Vcc is applied to the diagnosis terminal 19, and the testing terminal 18 is supplied with a positive voltage level Va higher than the positive voltage level Vcc by a value slightly larger than the sum of the threshold voltages of the n-channel type field effect transistors 14' to 16. In thi situation, if the fuse element was destroyed to memorize the replacement, no current flows from the testing terminal 18 to the diagnostic terminal 19 because the conducion path is blocked between the n-channel type field effect transistor 16 and the diagnostic terminal 19. On the other hand, no detective memory cell is detected and, accordingly, all of the memory cells of the array 2 are used to store data bits without replacement. A current flows from the testing terminal 18 to the diagnostic terminal 19, because all of the n-channel type field effect transistors 14' to 16 turn on to propagate the voltage level.

The address detecting section 13' is provided with a plurality of detecting circuits 20, 21 and 22 which are equal in number to the redundant decoder circuits 9 to 11, and the detecting circuits 20 to 22 are coupled in parallel between the diagnostic terminal 19 and the n-channel type field effect transistor 16. The detecting circuits 20 to 22 are respectively coupled in parallel to the respective n-channel type field effect transistors 12 to 14 and are respectively activated to provide conduction paths between the n-channel type field effect transistor 16 and the diagnostic terminal 19, respectively, when the replacing signals appear. All of the detecting circuits 20 to 22 are identical in circuit arrangement with one another, so that description is made for the detecting circuit 20 only for the sake of simplicity.

The detecting circuit 20 has an n-channel type field effect transistor 23 coupled between the n-channel type field effect transistor 16 and the diagnostic terminal 19, and a bootstrapping capacitor 24 with two electrodes one of which is coupled to the n-channel type field effect transistor 14 and the other of which is coupled to the gate electrode of the n-channel type field effect transistor 23. The detecting circuit 20 further has an n-channel type field effect transistor 25 coupled between the other electrode of the bootstrapping capacitor 24 and the diagnostic terminal 19. The detecting circuit 20 thus arranged is capable of providing the conduction path between the n-channel type field effect transistor 16 and the diagnostic terminal 19. Namely, when a replacement is memorized in the redundant decoder circuit 11, the redundant decoder circuit 11 allows the n-channel field effect transistor 14 to turn on to produce the replacing signal upon application of the row address signal assigned to the memory cell replaced with the redundant memory cell. As described above, the replacing signal is supplied to not only the row decoder circuit 6 but also the bootstrapping capacitor 24 of the detecting circuit 20. Then, positive charges are accumulated in the one electrode of the bootstrapping capacitor 24. The positive voltage level is supplied from the diagnostic terminal 19 through the n-channel type field effect transistor 25 to the other electrode of the bootstrapping capacitor 24, so that the voltage level at the gate electrode of the n-channel type field effect transistor 23 goes up beyond the positive voltage level Vcc. With the extremely high voltage level, the n-channel field effect transistor 23 fully turns on to propagate the voltage level between the n-channel type field effect transistor 16 and the diagnostic terminal 19. The voltage level between the n-channel type field effect transistor 16 and the diagnostic terminal 19 is slightly higher than the positive voltage level Vcc because of the voltage level Va at the testing terminal 18. Then, a current flows between the testing terminal 18 and the diagnostic terminal 19. However, if no replacing signal is produced by the n-channel type field effect transistor 14, the n-channel type field effect transistor 23 is turned off to block the conduction path. For this reason, no current is detected between the testing terminal 18 and the diagnostic terminal 19. In this way, the row address assigned to the defective memory cell is detected by the curent flowing from the testing terminal 18 and the diagnostic terminal 19.

However, a problem is encountered in the detecting circuit forming part of the redundant state detection unit 8 of the prior-art semiconductor memory device in complexity in circuit arrangement. Namely, each of the detecting circuits 20 to 22 is constituted by the three component elements, which are two n-channel type field effect transistors 23 and 25 and one bootstrapping capacitor 24, so that a large occupation area is consumed to form the address detecting section. If the rows of the redundant memory cells is increased to save the semiconductor memory device from rejection, the above problem becomes serious.

SUMMARY OF THE INVENTION

It is therefore an important object of the present invention to provide a semiconductor memory device which has a large number of the rows of the redundant memory cells without increasing in chip size.

It is also an important object of the present invention to provide a detecting circuit simple in circuit arrangement.

To accomplish these objects, the present invention proposes to share a bypassing transistor accompanied by a bootstrapping circuit with all activating transistors respectively associated with the redundanat decoder units.

In accordance with the present invention, there is provided a semiconductor memory device fabricaated on a semiconductor chip, comprising: (a) a plurality of memory cells arranged in rows and columns, the memory cells in the respective rows being coupled to a plurality of word lines, respectively, each of the memory cells having a possibility of a defective memory cell; (b) a plurality of redundant memory cells arranged in rows, the redundant memory cells in the respective rows being coupled to a plurality of redundant word lines, respectively; (c) address means for receiving address signals including a row address signal representative of a row address; (d) redundant decoder means having a plurality of redundant decoder units equal in number to the rows of the redundant memory cells, each of the redundant decoder units being capable of memorizing a row address assigned to the defective memory cell, each of the redundant decoder units being operative to produce a replacing signal for activating one of the redundant word lines when the row address memorized therein is identical with the row address represented by the row address signal; (e) address decoding means having a row address decoder circuit, the row address decoder circuit being operative to activate one of the word lines corresponding to the row address represented by the row address signal in the absence of the replacing signal, the row address decoder circuit being shifted into an inactive state in the presence of the replacing signal; and (f) redundant state detection means having an address detecting sectio operative to produce a first detecting a signal when the row address represented by the row address signal is identical with the row address memorized in one of the redundant decoder units, wherein the address detecting section comprises a single bypassing transistor coupled between a first node applied with a first voltage level and a second node, a single bootstrapping circuit operative to supply a gate electrode of the bypassing transistor with a second voltage level higher thana the first voltage level by a value larger than a threshold voltage of the bypassing transistor, and a plurality of activating transistors coupled in parallel between a source of a third voltage level and the bootstrapping circuit and having respective gate electrodes respectively supplied with replacing signals produced by the redundant decoder units, respectively, the second node being supplied with a voltage level lower than the first voltage level.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENT

Figure 1:
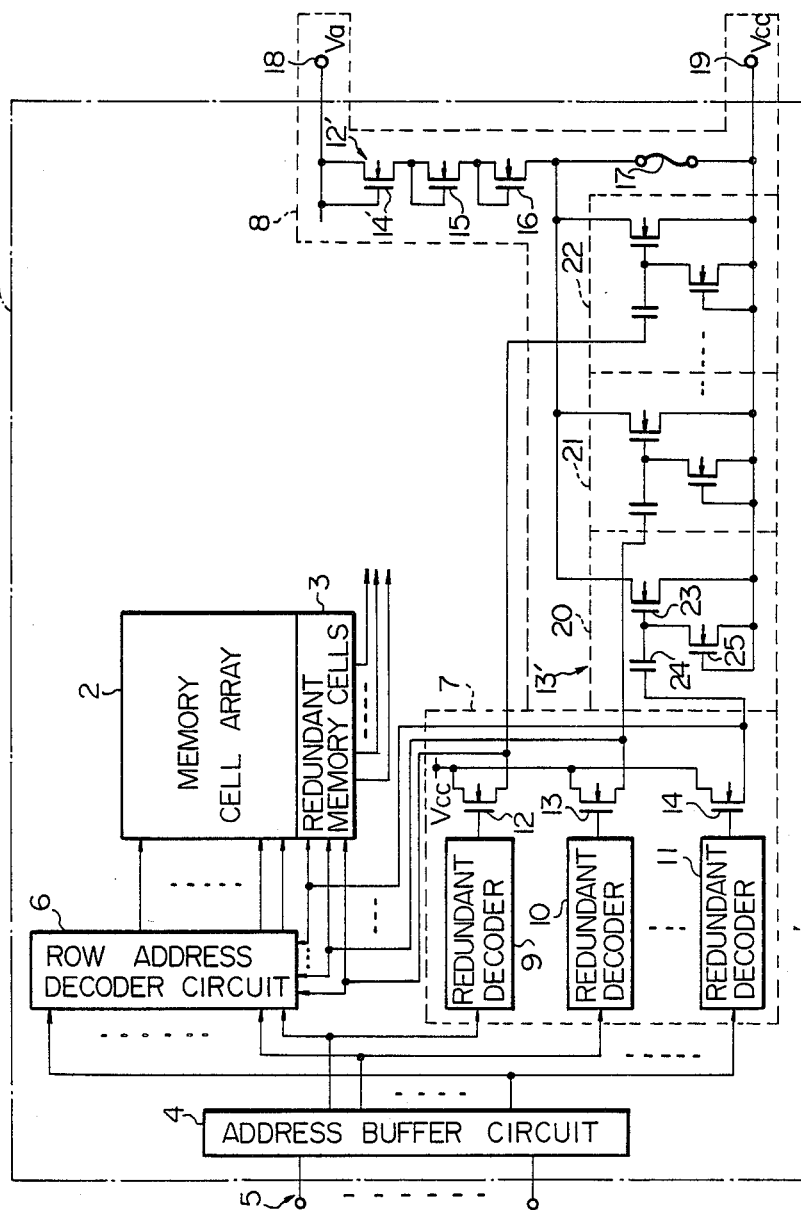
FIG. 1 is a circuit diagram showing the arrangement of a prior-art semiconductor memory device.
Figure 2:
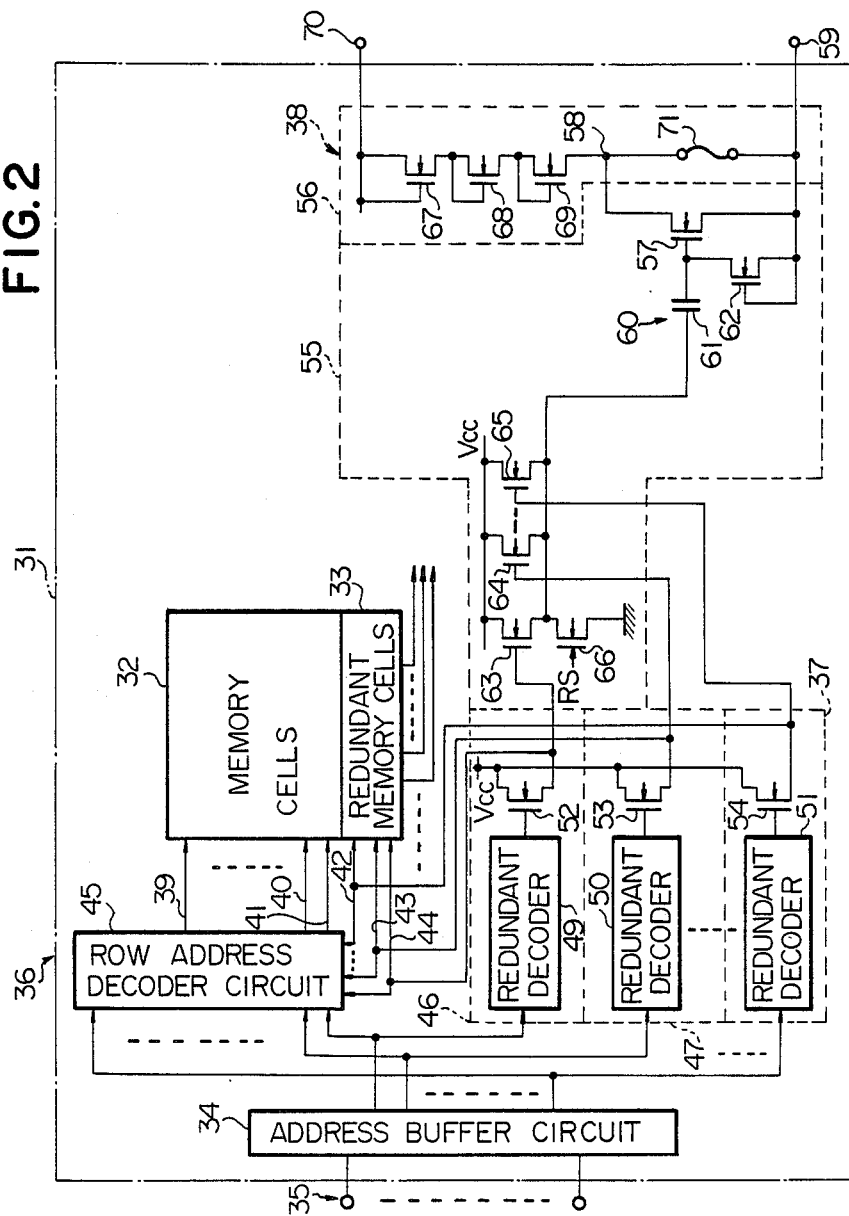
FIG. 2 is a circuit diagram showing the arrangement of a semiconductor memory device embodying the present invention.

Referring to FIG. 2 of the drawings, there is shown a semiconductor memory device embodying the present invention. The semiconductor memory device is fabricated on a single semiconductor chip 31, typically a single crystal silicon, and largely comprises a plurality of memory cells 32 arranged in rows and columns, a redundant memory cells 33 arranged in a plurality of rows, an address buffer circuit 34 associated with a plurality of address terminals 35 and temporary storing address signals, which are used as a row address signal and a column address signal, supplied from an outside source (not shown), an address decoding section 36, a redundant decoder section 37 and a redundant state detection circuit 38. The memory cells 32 in each row are coupled to a word line 39, 40 or 41 and the redundant memory cells in each row are coupled to a redundant word line 42, 43 or 44.

The address decoding section 36 is provided with a column address decoder (not shown) operative to decode the column address signal and a row address decoder circuit 45 coupled to the address buffer circuit 34 and operative to decode the row address signal for activating one of the word lines 39, 40 and 41, however the row address decoder circuit 45 is shifted into an inactive state when the redundant decoder section 37 produces a replacing signal.

The redundant decoder section 37 comprises a plurality of redundant decoder units 46, 47 and 48 coupled to the address buffer circuit 34, and each of the redundant decoder units 46, 47 and 48 is provided with a redundant decoder circuits 49, 50 or 51 and an n-channel type field effect transisstor 52, 53 or 54 coupled between a source of positive voltage Vcc and one of the redundant word lines. The n-channel type field effect transistorrs 52, 53 and 54 are further coupled to the row address decoder circuit 45 and the redundant state detection circuit 38. Each of the redundant decoder circuits 49, 50 and 51 is provided with a fuse element (not shown) which is destroyed for memorizing a row address assigned to a defective memory cell, and produces a high voltage signal when the row address memorized therein is identical with the row address represented by the row address signal. With the high voltage signal fed from the redundant decoder circuit, the n-channel type field effect transistor 52, 53 and 54 turns on to produce the replacing signal which is supplied to one of the redundant word lines 42, 43 and 44 for activation and to the row address decoder circuit 45 for inactivation.

The redundan state detection circuit 38 largely comprises an address decoding section 55 and a replacement memorizing section 56. The address decoding section 55 has an n-channel type bypassing transistor 57 coupled between a first node 58 and a diagnostic terminal 59 (which further serves as a power supplying terminal), a bootstrapping circuit 60 formed by a capacitor 61 coupled to a gate electrode of the bypassing transistor 57 and an n-channel type field effect transistor 62, and a plurality of n-channel type activating transistors 63, 64 and 65 coupled in parallel between the source of positive voltage Vcc and the capacitor 61. The activating transistor are equal in number to the n-channel type field effect transistors 52, 53 and 54, and the replacing signal produced by one of the n-channel type field effect transistors 52, 53 and 54 is supplied to the corresponding activating transistor 63, 64 and 65. The address decoding section 55 further has an n-channel type resetting transistor 66 coupled between the capacitor 61 and a ground terminal and responsive to a resetting signal RS for causing the bypassing transistor 57 to turn off.

The replacement memorizing section 56 has a series combination of n-channel type field effect transistors 67, 68 and 69 coupled between a testing terminal 70 and the first node 58 and a fuse element 71 coupled between the first node 58 and the diagnostic terminal 59. When one of the rows having a defective memory cell is replaced with one of the rows of the redundant memory cells 3, the fuse element 71 is destroyed to isolate the first node 58 from the diagnostic terminal 59. However, the fuse element 71 can provide a conduction path if no defective memory cell is detected.

Description will be hereinunder made for operations of the semiconductor memory device shown in FIG. 2 on the assumption that one of the memory cells 2 is detected as the defective memory cell and, accordingly, replaced with one of the redundanat memory cells 3. In this situation, the fuse element incorporated in, for example, the redundant decoder circuit 49 is destroyed, and the fuse element 71 is also destroyed for representing the replacement. After this replacement, the semiconductor memory device is mounted on a electric board (not shown) for forming part of an electronic system. In a commercial operation of the electronic system, the detective memory cell is accessed by the outside source with the row address signal representing the row address assigned to the defective memory cell and the column address signal representing the column address also assigned to the defective memory cell. The row address signal is latched by the address buffer circuit 34 and transferred in parallel to the row address decoder circuit 45 and the redundant decoder section 37. With the address represented by the address signal, the reduntant decoder circuit 49 produces the high voltage signal, and the n-channel type field effect transistor 52 turns on to produce the replacing signal. The replacing signal is supplied to not only the row address decoder circuit 45 for inactivation but also the redundant word line 44 for activation. As described hereinbefore, the row address decoder circuit 45 is shifted into the inactive state in the presence of the replacing signal, and, for this reason, no word line is activated. With the replacing signal, the word line 44 is activated, so that all of the redundant memory cells coupled to the redundant word line 44 are also activated for access. When the column address signal is decoded, a data bit is read out or written into the redundant memory cell corresponding to the defective memory cell.

If there is a necessity to decide whether or not the defective memory cell is incorporated in the memory cells 32. The testing terminal 70 is supplied with a positive voltage level higher than the voltage level Vcc by a predetermined value, and the voltage level Vcc is applied to the diagnostic terminal 59. In this instance, the predetermined value is slightly higher than the sum of the threshold voltages of the n-channel type field effect transistors 67, 68 and 69. If no memory cell was replaced with the redundant memory cell, the fuse element was not destroyed, so that a current would flow from the testing terminal through the n-channel type field effect transistors 67 to 69 and the fuse element 71 to the diagnostic terminal 59. However, the fuse element 71 was destroyed for representing the replacement, so that no current flows between the testing terminal 70 and the diagnostic terminal 59.

Moreover, if the row address assigned to the defective memory cell is needed for further analysis. The row address signal applied to the address terminals 35 is incremented for causing the redundant decoder unit 46 to produce the replacing signal. When the row address represented by the row address signal is matched with the row address memorized into the redundant decoder circuit 49, the n-channel type field effect transistor 52 turns on to produce the replacing signal which is transferred to the activating transistor 63. With the replacing signal, the activating transistor 63 turns on to supply the capacitor 61 with positive charges, so that the capacitor 61 is accumulated with the positive charges. The positive voltage level Vcc is supplied through the n-channel type field effect transistor 62 to the capacitor 61, so that the voltage level at the gate electrode of the bypassing transistor 57 excesses the sum of the voltage level Vcc and the threshold voltage of the bypassing transistor 57. Then, the bypassing transistor fully turns on to provide a conduction path between the first node 58 and the diagnostic terminal 59, and a current flows from the testing terminal 70 through the n-channel type field effect transistors 67 to 69 and 57 to the diagnostic terminal 59. However, the row address represented by the row address signal is not matched with the row address assigned to the defective memory cell, no charge is supplied to the capacitor 61, and the bypassing transistor 57 keeps off. This means that no current flows between the testing terminal 70 and the diagnostic terminal 59.

Although particular embodiments of the present invention have been shown and described, it will be obvious to those skilled in the art that various changes and modifications may be made without departing from the spirit and scope of the present invention.

What is claimed is:

1. A semiconductor memory device fabricated on a semiconductor chip, comprising:
   (a) a purality of memory cells arranged in rows and columns, said memory cells in the respective rows being coupled to a plurality of word lines, respectively, each of said memory cells having a possibility of a defective memory cell;
   (b) a plurality of redundant memory cells arranged in rows, said redundant memory cells in the respective rows being coupled to a plurality of redundant word lines, respectively;
   (c) address means for receiving address signals including a row address signal representative of a row address;
   (d) redundant decoder means having a plurality of redundant decoder units equal in number to the rows of said redundant memory cells, each of said redundant decoder units being capable of memorizing a row address assigned to said defective memory cell, each of said redundant decoder units being operative to produce a replacing signal for activating one of said redundant word lines when the row address memorized therein is identical with the row address represented by said row address signal;
   (e) address decoding means having a row address decoder circuit, said row address decoder circuit being operative to activaate one of said word lines corresponding to the row address represented by said row address signal in the absence of said replacing signal, said row address decoder circuit being shifted into an inactive state in the presence of said replacing signal; and
   (f) redundant state detection means having an address detecting section operative to produce a first detecting signal when the row address represented by said row address signal is identical with the row address memorized in one of said redundant decoder units, wherein said address detecting section comprises a single bypassing transistor coupled between a first node applied with a first voltage level and a second node, a single bootstrapping circuit operative to supply a gate electrode of said bypassing transistor with a second voltage level higher than said first voltage level by a value larger than a threshold voltage of said bypassing transistor, and a plurality of activaating transistors coupled in parallel between a source of a third voltage level and said bootstrapping circuit and having respective gate electrodes respectively supplied with replacing signals produced by said redundant decoder units, respectively, said second node being supplied with a voltage level lower than said first voltage level.

2. A semiconductor memory device as set forth in claim 1, in which said bootstrapping circuit comprises a capacitor coupled between said activating transistors and said bypassing transistor, and a field effect transistor coupled between the gate electrode of said bypassing transistor and said second node.

3. A semiconductor memory device as set forth in claim 2, in which said address detecting section further comprises a resetting transistor coupled between said bootstrapping circuit and a source of a fourth voltage level.

4. A semiconductor memory device as set forth in claim 2, in which said redundant state detection means further have a replacement memorizing section capable of producing a second detecting signal when said defective memory cell was replaced with said redundant memory cell.

5. A semiconductor memory device as set forth in claim 4, in which said replacement memorizing section has a series combination of resistor elements coupled between a testing node and said first node, and a fuse element coupled between said first node and said second node.

6. A semiconductor memory device as set forth in claim 5, in which each of said resistor elements is formed by a field effect transistor having a gate electrode coupled to a source electrode thereof.

7. A semiconductor memory device as set forh in claim 6, in which said bypassing transistor, said field effect transistor forming part of said bootstrapping circuit, said activating transistors and field effect transistors forming part of said replacement memorizing section are formed by n-channel type field effect transistors, respectively.

8. A semiconductor memory device as set forth in claim 7, in which said first voltage level and said third voltage level are approximately equal to each other and in which said fourth voltage level is approximately equal to the ground voltage level.

9. A semiconductor memory device as set forth in claim 8, in which each of said redundanat decoder units has a redundant decoder circuit operaative to memorize the row address assigned to said defective memory cell and operaative to produce a high voltage signal when the row address memorized therein is identical with the row address represented by said row address signal, and an n-channel type field effect transistor having a gate electrode applied with the high voltage signal and coupled between the source of said fourth voltage level and a node where said row decoder circuit, one of said redundant word lines and said activating transistor are electrically connected.

10. A semiconductor memory device fabricated on a semiconductor chip, comprising:
   (a) a plurality of memory cells arranged in rows and coluns, said memory cells in the respective rows being coupled to a plurality of word lines, respectively, each of said memory cells having a possibility of a defective memory cell;
   (b) a plurality of redundant memory cells arranged in rows, said redundant memory cells in the respective rows being coupled to a plurality of redundant word lines, respectively;
   (c) address means for receiving address signals including a row address signal representative of a row address;
   (d) redundant decoder means having a plurality of redundant decoder units equal in number to the rows of said redundant memory cells, each of said redundant decoder units being capable of memorizing a row address assigned to said defective memory cell, each of said redundant decoder units being operative to produce a replacing signal for activating one of said redundant word lines when the row address memorized therein is identical with the row address represented by said row address signal;

(e) address decoding means having a row address decoder circuit, said row address decoder circuit being operative to activate one of said word lines corresponding to the row address represented by said row address signal in the absence of said replacing signal, said row address decoder circuit being shifted into an inactive state in the presence of said replaciing signal; and (f) redundant state detection means having an address detecting section operative to produce a first detecting signal when the row address represented by said row address signal is identicla with the row address memorized in one of said redundant decoder units, and a replacement memorizing section capable of producing a second detecting signal when said defective memory cell was replaced with said redundant memory cell, in which said address detecting section comprises an n-channel type single bypassing transistor coupled between a first node applied with a first voltage level and a second node where said first and second detecting signals appear in the form of currents, a single bootstrappping circuit operative to supply a gate electrode of saidi bypassing transistor with a second voltage level higher than said first voltage level by a value larger than a threshold voltage of said bypassing transistor, and a plurality of activating transistors coupled in parallel between a source of a third voltage level and said bootstrapping circuit and having respective gate electrodes respectively supplied with the replacing signals produced by said redundant decoder units, respectively, said bootstrapping circuit having a capacitor coupled between said activating transistors and the gate electrode of said bypassing transistor and an n-channel type field effect transistor coupled between the gate of said bypassing transistor and said second node, said second node being supplied with a voltage level slightly lower than said first voltage level, and in which said replacement memorizing secion has a series combination of n-channel type field effect transistors coupled between a testing node and said first node, and a fuse element coupled between said first node and said second node, each of said n-channel type field effect transistors of said series combination having a gate electrode coupled to a source electrode thereof.

* * * * *

UNITED STATES PATENT AND TRADEMARK OFFICE
CERTIFICATE OF CORRECTION

PATENT NO. : 4,885,721

DATED : December 5, 1989

INVENTOR(S) : Naoki Katanosaka

Page 1 of 3

It is certified that error appears in the above-identified patent and that said Letters Patent is hereby corrected as shown below:

Column 1, line 20, delete "signls", and insert --signals--.

Column 1, line 38, delete "effec", and insert --effect--.

Column 1, line 44, delete "aarry", and insert --array--.

Column 1, line 60, delete "redundan", and insert --redundant--.

Column 2, line 1, delete "ech", and insert --each--.

Column 2, line 22, delete "thi", and insert --this--.

Column 4, line 17, delete "sectio", and insert --section--.

Column 4, line 26, delete "thana", and insert --than--.

Column 5, line 13, delete "transisstor", and insert --transistor--.

Column 5, line 15, delete "transistorrs", and insert --transistors--.

UNITED STATES PATENT AND TRADEMARK OFFICE
CERTIFICATE OF CORRECTION

PATENT NO. : 4,885,721

DATED : December 5, 1989

INVENTOR(S) : Naoki Katanosaka

It is certified that error appears in the above-identified patent and that said Letters Patent is hereby corrected as shown below:

Column 5, line 30, delete "redundan", and insert --redundant--.

Column 5, line 66, delete "redundanat", and insert --redundant--.

Column 6, line 15, delete "reduntant", and insert --redundant--.

Column 7, line 61, delete "activaating", and insert --activating--.

Column 8, line 41, delete "redundanat", and insert --redundant--.

Column 8, line 42, delete "operaative", and insert --operative--.

Column 8, line 44, delete "operaative", and insert --operative--.

Column 8, line 56, delete "coluns", and insert --columns--.

Column 9, line 17, delete "replaciing", and insert --replacing--.

Column 9, line 21, delete "identicla", and insert --identical--.

UNITED STATES PATENT AND TRADEMARK OFFICE
CERTIFICATE OF CORRECTION

PATENT NO. : 4,885,721

DATED : December 5, 1989

INVENTOR(S) : Naoki Katanosaka

Page 3 of 3

It is certified that error appears in the above-identified patent and that said Letters Patent is hereby corrected as shown below:

Column 9, line 4, delete "saidi", and insert --said--.

Column 10, line 22, delete "secion", and insert --section--

Signed and Sealed this

Second Day of April, 1991

*Attest:*

HARRY F. MANBECK, JR.

*Attesting Officer*

*Commissioner of Patents and Trademarks*